(12) United States Patent
Honda

(10) Patent No.: US 7,893,749 B2
(45) Date of Patent: Feb. 22, 2011

(54) HIGH FREQUENCY SWITCH CIRCUIT HAVING REDUCED INPUT POWER DISTORTION

(75) Inventor: Yuri Honda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/318,019

(22) Filed: Dec. 19, 2008

(65) Prior Publication Data

US 2009/0184747 A1   Jul. 23, 2009

(30) Foreign Application Priority Data

Jan. 22, 2008   (JP)   ............................. 2008-011188
Oct. 29, 2008   (JP)   ............................. 2008-278439

(51) Int. Cl.
*H03K 17/00* (2006.01)
(52) U.S. Cl. ....................... 327/365; 327/415; 327/430; 333/101; 333/102; 333/103
(58) Field of Classification Search ................. 327/365, 327/415, 430; 333/101–103
See application file for complete search history.

(56) References Cited

U.S. PATENT DOCUMENTS

| | | | | |
|---|---|---|---|---|
| 7,199,635 | B2 * | 4/2007 | Nakatsuka et al. | 327/308 |
| 7,345,521 | B2 * | 3/2008 | Takahashi et al. | 327/308 |
| 7,492,238 | B2 * | 2/2009 | Nakatsuka et al. | 333/103 |
| 7,636,004 | B2 * | 12/2009 | Nakatsuka et al. | 327/308 |

FOREIGN PATENT DOCUMENTS

JP   4-89623   8/1992

* cited by examiner

*Primary Examiner*—Kenneth B. Wells
(74) *Attorney, Agent, or Firm*—McGinn IP Law Group, PLLC

(57) ABSTRACT

There has been a problem that the distortion characteristic of a switch circuit for a high frequency is deteriorated. A switch circuit in accordance with one aspect of the present invention includes a transistor connected in series between input and output terminals, a control terminal that receives a signal to control the conductive state of the transistor, a first resistor connected between the control electrode of the transistor and the control terminal, and a series circuit of a diode and a second resistor, the series circuit being connected in parallel with the first resistor between the control terminal and the control electrode of the transistor.

16 Claims, 11 Drawing Sheets

HIGH FREQUENCY SWITCH CIRCUIT HAVING REDUCED INPUT POWER DISTORTION

BACKGROUND

1. Field of the Invention

The present invention relates to a high frequency switch circuit, and is to realize a switch circuit having a high input power characteristic.

2. Description of Related Art

As mobile communication equipment has become more sophisticated in recent years, it has been desired to miniaturize high frequency semiconductor devices for use in terminal units and to improve their performance. In particular, a high frequency switch circuit to switch an antenna has been required to have lower insertion loss, lower distortion, and higher input power simultaneously.

Furthermore, mobile communication equipment that is capable of handling plural frequencies often uses a switch capable of making a "1-to-n" selection (hereinafter called "SPnT switch") as the switch to switch an antenna. Typically, a junction type field effect transistor (hereinafter called "J-FET") formed on a GaAs substrate is used for such a switch to switch an antenna.

A SPnT switch has a single or several field effect transistors (hereinafter called "FETs") connected as a switch element between plural output terminals (or input terminals) and a single input terminal (or output terminal), and connects given input and output terminals by inputting a control signal to the control electrode (gate electrode) of the FET.

In such a switch element using a FET, the response time to the control signal is delayed due to the gate capacitance or the like. Accordingly, Japanese Unexamined Utility Model Application Publication No. 4-89623 discloses a technique to reduce the switching time between the on/off states of a metal oxide semiconductor field effect transistor (hereinafter called "MOSFET") by connecting bidirectional diodes 200 in parallel between the gate electrode of the MOSFET and a pulse generator 100 (see FIG. 12).

SUMMARY

However, when used as a switch circuit for a high frequency, a J-FET that is located on the path for the off-state must be brought to the off-state with certainty by connecting a resistor between the gate electrode of the J-FET and the control terminal. Meanwhile, if bidirectional diodes are directly connected to the gate electrode of the J-FET of a switch circuit used in a high frequency circuit in a similar manner to the MOSFET shown in Japanese Unexamined Utility Model Application Publication No. 4-89623 in an attempt to increase the speed, the diodes repeatedly turn on and off when a high frequency signal (RF signal) is input to the circuit. Therefore, there has been a problem that the distortion characteristic of the switch circuit is deteriorated.

A first exemplary aspect of an embodiment of the present invention is a switch circuit including: a transistor connected in series between input and output terminals; a control terminal that receives a signal to control the conductive state of the transistor; a first resistor connected between the control electrode of the transistor and the control terminal; and a series circuit of a diode and a second resistor, the series circuit being connected in parallel with the first resistor between the control terminal and the control electrode of the transistor. In a switch circuit constructed in a manner described above, the distortion of an input signal can be reduced by the second resistor.

It becomes possible to provide a high frequency switch having an excellent characteristic for input power without deteriorating the distortion characteristic.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

The present invention is explained hereinafter in detail with reference to the drawings.

First Exemplary Embodiment

Figure 1:
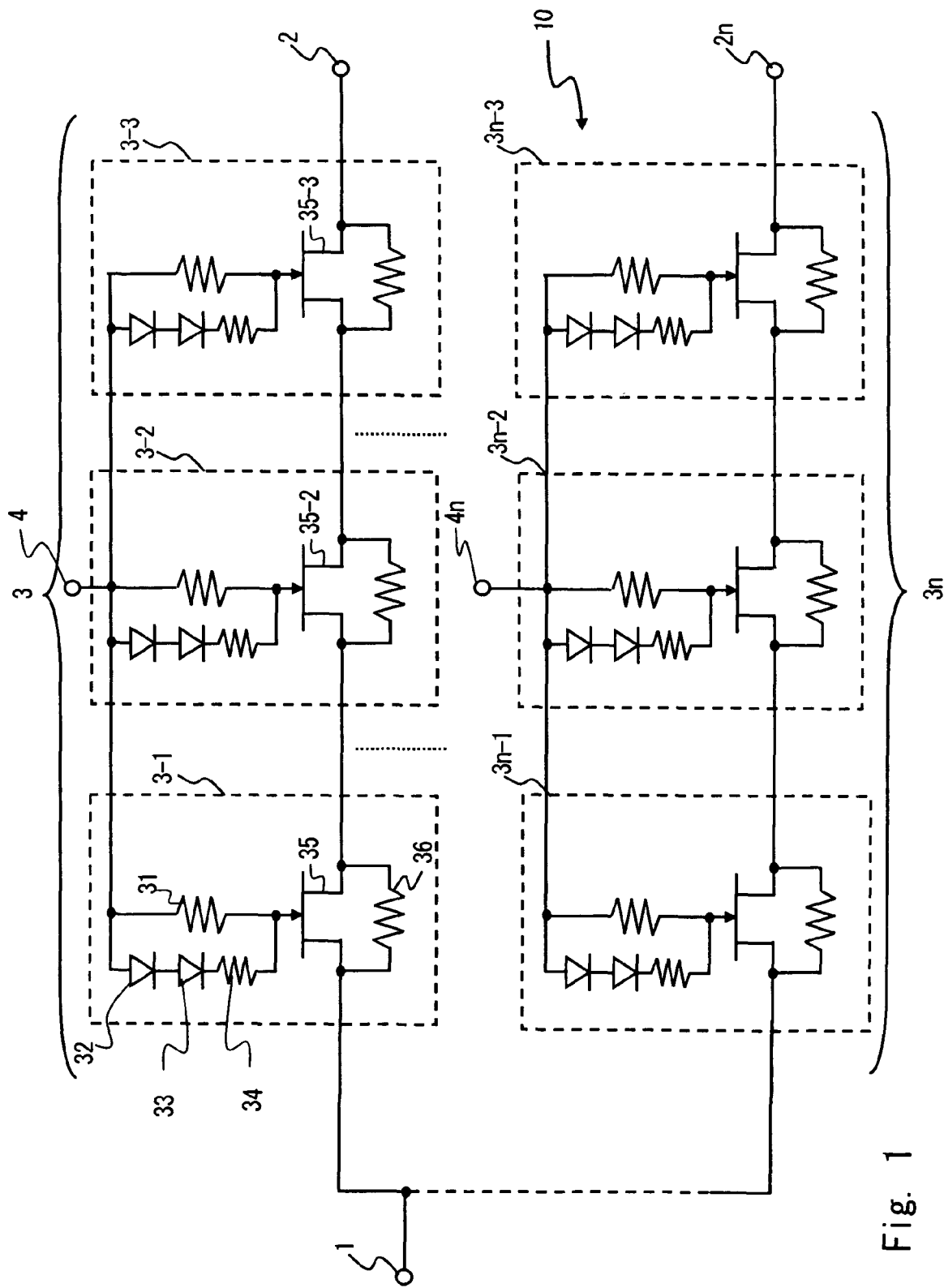
FIG. 1 is a circuit diagram showing a switch circuit 10 in accordance with an exemplary embodiment of the present invention.

FIG. 1 is a circuit diagram showing a switch circuit 10 in accordance with an exemplary embodiment of the present invention. As shown in FIG. 1, the switch circuit 10 for a high frequency in accordance with an exemplary embodiment includes input/output terminal 1 (which is hereinafter explained mainly as to function as an input terminal to distinguish from input/output terminals 2), a plurality of input/output terminals 2-2n (which are hereinafter explained mainly as to function as output terminals to distinguish from the input/output terminal 1), a plurality of switch elements 3-3n, and a plurality of control terminals 4-4n. That is, the switch circuit 10 in accordance with an exemplary embodiment is a SPnT switch. The switch circuit 10 is, for example, a switch circuit to make a "1-to-n" connection for a single antenna.

Note that the switch circuit 10 shown in FIG. 1 is a switch circuit to input and output a signal in a high frequency band such as a frequency band on the order of gigahertz (Ghz). Therefore, a J-FET formed on a GaAs substrate is used as a transistor that is used as the switch. Each of the switch elements 3-3n has a plurality of unit switch elements (3-1-3-3 and 3n-1-3n-3). The plurality of unit switch elements (3-1-3-3 and 3n-1-3n-3) are connected in series between the input terminal 1 and the output terminals 2-2n. The detailed configuration of each unit switch element will be explained later.

Furthermore, although only two output terminals 2 and 2n are shown for the single input terminal 1 in FIG. 1 for simplification of the drawing, the switch circuit 10 in accordance with an exemplary embodiment is a SPnT switch as stated above. Therefore, it is also possible to have a plurality of output terminals 2k (k is a given natural number) between the output terminals 2 and 2n. Furthermore, although an example where three unit switch elements (3-1-3-3 and 3n-1-3n-3) are connected between the input terminal 1 and the output terminals 2 and 2n is illustrated in FIG. 1, any given number of the unit switch elements, including a single unit switch element, can be connected between the input and output terminals. However, when used as a high frequency switch circuit, the switch elements using plural J-FETs are preferable in order to improve the frequency characteristic.

The input terminal 1 is a terminal to receive a high frequency signal (RF signal). The input terminal 1 is connected to an antenna or the like, and receives an RF signal received by the antenna (when functioning as an output terminal, it outputs a signal input to a given one of the input/output terminals 2-2n to the antenna). The output terminals 2 and 2n are output terminals to output a signal input to the input terminal 1 to a circuit in a subsequent stage (when functioning as input terminals, they input a signal input to a given one of the input/output terminals 2-2n to the input/output terminal 1). The control terminals 4-4n are terminals to input control signals to connect the input terminal 1 to a given one of the output terminals 2 and 2n. The input terminal 1 and a given one of the output terminals 2 and 2n are connected based on singles input to these control terminals 4-4n. The switch elements 3-3n are elements to determine the connection state between the input terminal 1 and the output terminals 2 and 2n based on control signals input to the control terminals 4-4n.

Since the structures of the unit switch elements (3-1-3-3 and 3n-1-3n-3) used as the switch elements 3-3n are identical with each other in an exemplary embodiment, the detailed structure is explained only for the unit switch element 3-1. The detailed explanation for the structures of other unit switch elements (3-2, 3-3, and 3n-1-3n-3) is omitted.

The unit switch 3-1 includes a first resistor 31, diodes 32 and 33, a second resistor 34, a J-FET 35, and a bias supply resistor 36.

The first resistor 31 is connected in series between the control terminal 4 and the control electrode (gate electrode) of the J-FET 35. The diodes 32 and 33 are connected in series between the control terminal 4 and the gate electrode of the J-FET 35. Each of the diodes 32 and 33 is connected such that its anode is located on the control terminal 4 side and its cathode is located on the gate electrode side of the J-FET 35. The second resistor 34 is connected in series between the diodes 32 and 33 and the gate electrode of the J-FET 35. The diodes 32 and 33 and the second resistor 34 are connected in parallel with the first resistor 31. Note that any given number of diodes can be used as the diodes 32 and 33, and the configuration of the diodes is not limited to the two-stage connection shown in FIG. 1.

The J-FETs 35 are connected in series between the input terminal 1 and the output terminal 2. In an exemplary embodiment, since the switch element 3 has such a structure that three J-FETs functioning as switches are connected in series, it is configured such that the source (drain) of the J-FET 35 of the unit switch element 3-1 is connected to the source (drain) of the J-FET 35-2 of the unit switch element 3-2. As stated above, since the number of the unit switch elements between the input and output terminals can be arbitrarily selected, the source (drain) of the J-FET 35 may be directly connected to the output terminal 2. The gate electrode of the J-FET 35 is connected to the control terminal 4 as described above, and the conductive state of the J-FET 35 is determined by a control signal input to the control terminal 4.

The bias supply resistor 36 is a resistive element to adjust the impedance between the input and output terminals when no connection is made between the input and output terminals. The bias supply resistor 36 is connected, between the source and the drain of the J-FET 35, in parallel with the J-FET 35.

The operation of the switch circuit 10 having such a structure in accordance with an exemplary embodiment of the present invention is explained hereinafter. Note that since the operations of the unit switch elements (3-1-3-3 and 3n-1-3n-3) are also identical with each other, the detail of the operation is explained only for the unit switch element 3-1 in the following explanation of the operation.

Assuming that the diodes 32 and 33 and the second resistor 34 are not connected, when a potential at the control terminal 4 rises from a low level to a high level, the gate potential of the J-FET 35 is determined by a current flowing through the first resistor 31 and the gate capacitance of the J-FET 35.

However, the diodes 32 and 33 and the second resistor 34 are connected in parallel with the first resistor 31 in an exemplary embodiment of the present invention. Therefore, if the gate potential of the J-FET 35 is Vg, the threshold voltage of each of the diodes 32 and 33 connected in two stages is VF, the resistance of the second resistor 34 is R2, and the current flowing from the control terminal 4 to the gate electrode of the J-FET 35 through the diodes 32 and 33 and the second resistor 34 is Ig, the gate potential of the J-FET 35 rises through the current path of the diodes 32 and 33 and the second resistor 34 until the following inequality is satisfied.

$$Vg > 2 \cdot VF + R2 \cdot Ig \tag{1}$$

Figure 2:
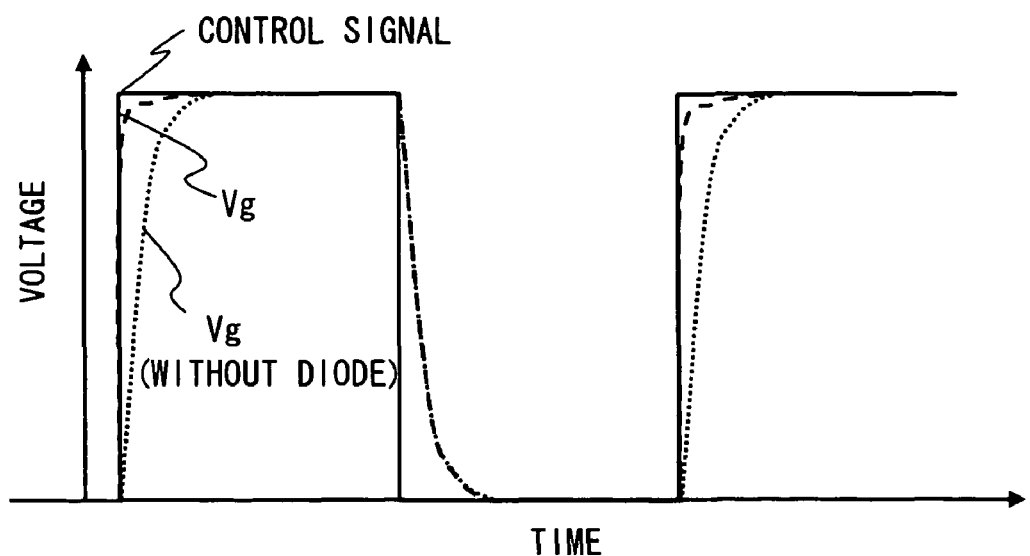
FIG. 2 shows an aspect of changes in a gate potential Vg with respect to a control signal.

After the gate potential Vg reaches the voltage expressed by the above-described inequality (1), the gate potential Vg of the J-FET 35 rises by a current flowing through the first resistor 31. In this manner, it is possible to reduce the time necessary to bring the J-FET 35 to the on-state in response to the rising edge at the control terminal 4 by providing the current path through the diodes 32 and 33 and the second resistor 34 as a path to charge the gate electrode of the J-FET 35 in an exemplary embodiment of the present invention. FIG. 2 shows an aspect of changes in the gate potential Vg with respect to the control signal. In FIG. 2, the solid line represents changes in the control signal input to the control terminal 4, and the broken line represents changes in the gate potential Vg in an exemplary embodiment of the present invention. Furthermore, the dotted line represents changes in the gate potential Vg in the case where the current path through the diodes 32 and 33 and the second resistor 34, which is shown in an exemplary embodiment of the present invention, is not provided.

Figure 12:
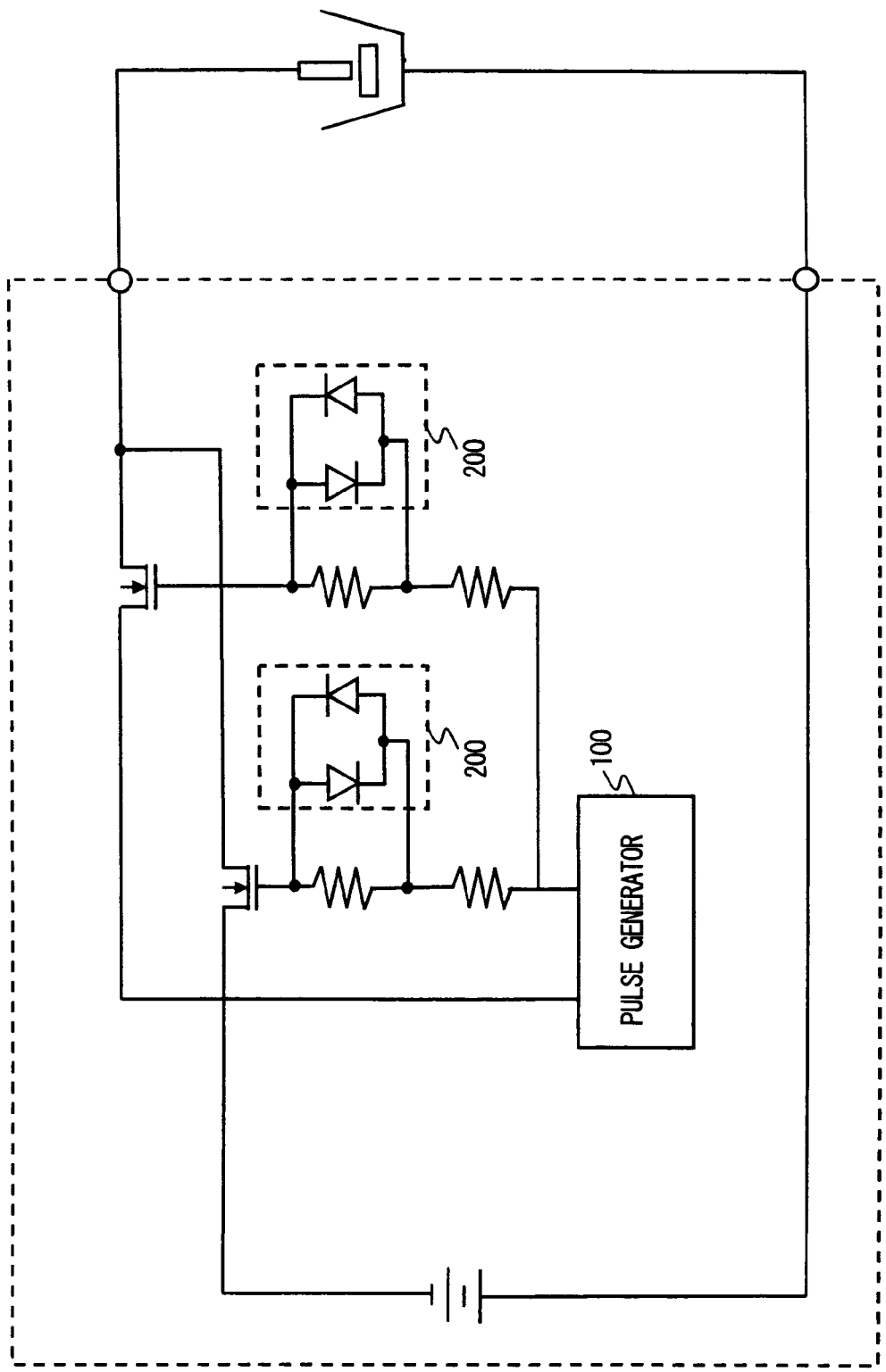
FIG. 12 shows a switch circuit using MOSFETs.

Furthermore, the second resistor 34 is also provided between the diode 33 and the gate electrode of the J-FET 35 in an exemplary embodiment. This second resistor 34 can reduce the distortion to the input signal even when an RF signal having a large voltage amplitude is input to the input terminal 1. If a bidirectional diode is directly connected to the gate electrode of the MOSFET as shown in FIG. 12, a voltage having a large amplitude corresponding to the input signal is applied to the gate of the J-FET 35 located on the path that is to be brought to the off-state in the SPnT switch (e.g., the path between the input terminal 1 and the output terminal 2). With regard to this amplitude, if the voltage amplitude of the input signal is VRF, and the path to the output terminal 2 is to be brought to the off-state, a voltage having an amplitude expressed as ⅚·VRF is applied to the gate electrode of the J-FET 35 of the unit switch element 3-1 (assuming that the capacitances between the gates and sources and between the gates and drain are identical among all of the J-FETs, since the switch element 3 is configured such that three J-FETs are connected in series, the voltage amplitude expressed as ⅚·VRF is applied to the gate electrode of the J-FET 35).

When a voltage having such a voltage amplitude is provided to the diode, the diode repeatedly turns on and off. As a result, the distortion to the input signal provided to the input terminal 1 becomes larger due to reflection or the like at the output end on the path that is to be brought to the off-state. Accordingly, the voltage amplitude is divided by inserting the second resistor 34 between the diodes 32 and 33 and the gate electrode of the J-FET 35 in an exemplary embodiment of the present invention. In this manner, even when a signal having a large voltage amplitude is input to the input terminal 1, it is possible to reduce the effect on the gate electrode of the J-FET 35 caused by that large voltage amplitude by using the diodes 32 and 33 and the second resistor 34. Note that it is possible to adjust the divided voltage values at the input terminal 1 as appropriate by determining an appropriate number of diodes to be connected and an appropriate resistance value of the second resistor based on the range of the voltage amplitude of a signal to be input or a similar parameter. With such a structure, it is possible to improve the distortion characteristic for an input signal in accordance with an exemplary embodiment of the present invention.

That is, the second resistor 34 is provided between the diodes 32 and 33, which cause distortion, and the gate electrode of the J-FET 35. If the voltage component of the distortion caused at the diodes 32 and 33 is VDi, the resistance of the second resistor 34 is R34, and each of the capacitances between the gate and the source and between the gate and the drain of the J-FET 35 at the off-state is Coff, the voltage VGn appearing at the gate electrode of the J-FET 35 by this voltage component VDi is expressed by the following equation (where the impedance at the input terminal is 50 ohm).

$$VGn = VDi \times \frac{\frac{1}{\omega Coff} + 50}{\frac{1}{\omega Coff} + 50 + R34} \qquad (2)$$
$$= VDi \times \frac{1 + 50\omega Coff}{1 + \omega Coff(50 + R34)}$$

As can be seen from the equation (2), the effect by the voltage component of the distortion that is caused at the diodes 32 and 33 and appears at the gate electrode of the J-FET 35 becomes smaller with increase in the resistance R34.

If this second resistor 34 is connected between the diodes 32 and 33 and the control terminal 4, the above-described equation (2) is expressed by the following equation, and the effect by the voltage component of the distortion generated at the diodes appears directly at the gate electrode of the J-FET.

$$VGn = VDi \times \frac{\frac{1}{\omega Coff} + 50}{\frac{1}{\omega Coff} + 50} = VDi \qquad (3)$$

Figure 3:
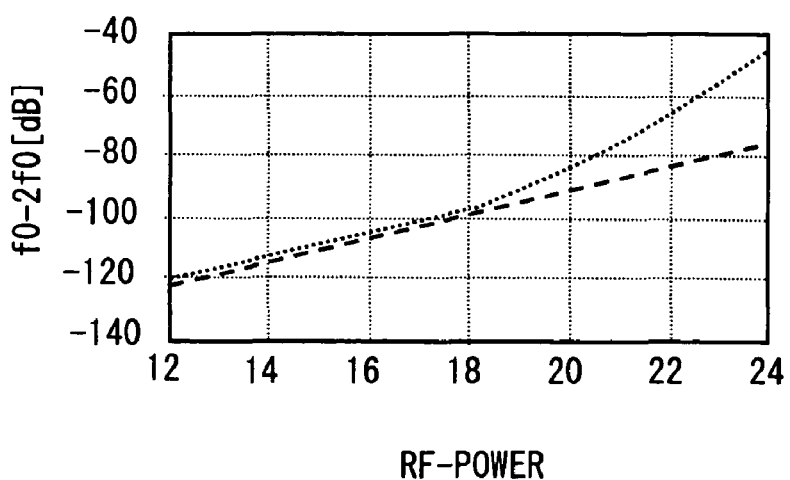
FIG. 3 shows a harmonic characteristic of a switch circuit in accordance with an exemplary embodiment of the present invention when the power of an RF signal input to an input terminal 1 is increased.
Figure 4:
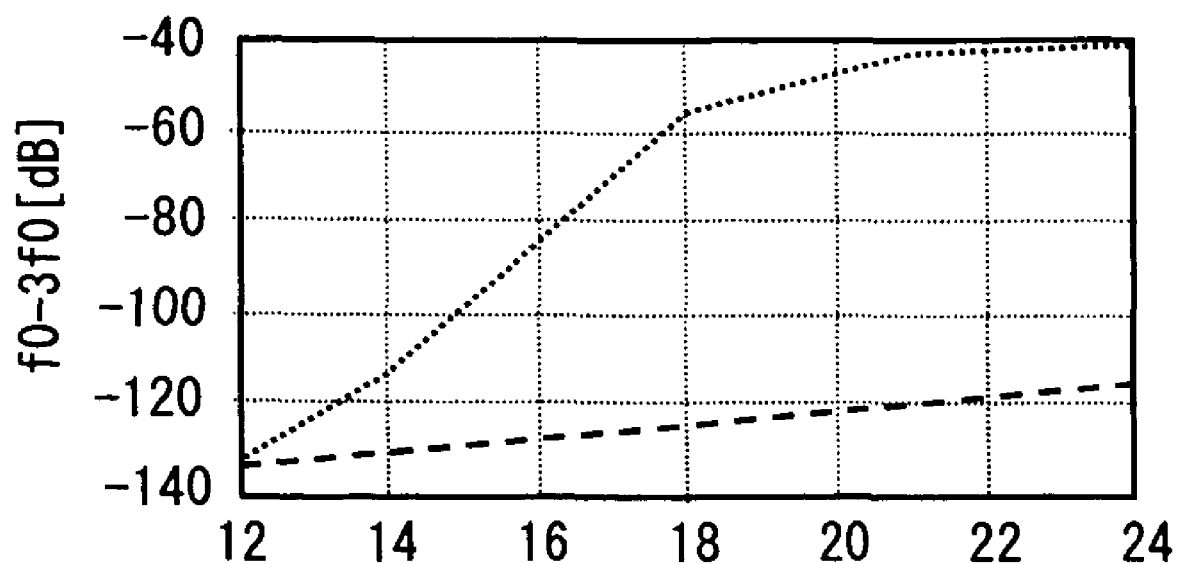
FIG. 4 shows a harmonic characteristic of a switch circuit in accordance with an exemplary embodiment of the present invention when the power of an RF signal input to an input terminal 1 is increased.

FIGS. 3 and 4 show a harmonic characteristic of the switch circuit 10 in accordance with an exemplary embodiment of the present invention as the power of an RF signal input to the input terminal 1 is increased. FIG. 3 shows a harmonic characteristic (f0-2f0) for the double harmonic of the input signal. FIG. 4 shows a harmonic characteristic (f0-3f0) for the triple harmonic of the input signal. In FIGS. 3 and 4, the dotted lines represent, for comparison, an example where the bidirectional diode is connected without the intervention of the second resistor 34 in contrast to an exemplary embodiment of the present invention. The broken lines represent an example where the second resistor 34 is inserted as shown in an exemplary embodiment of the present invention. As shown in FIGS. 3 and 4, the switch circuit 10 in accordance with an exemplary embodiment of the present invention can reduce the distortion in the switch circuit, and therefore does not deteriorate the power efficiency.

As has been explained above, an exemplary embodiment of the present invention can provide a switch circuit for a harmonic capable of following changes in the control signal at high speed without deteriorating the power efficiency.

Second Exemplary Embodiment

Figure 5:
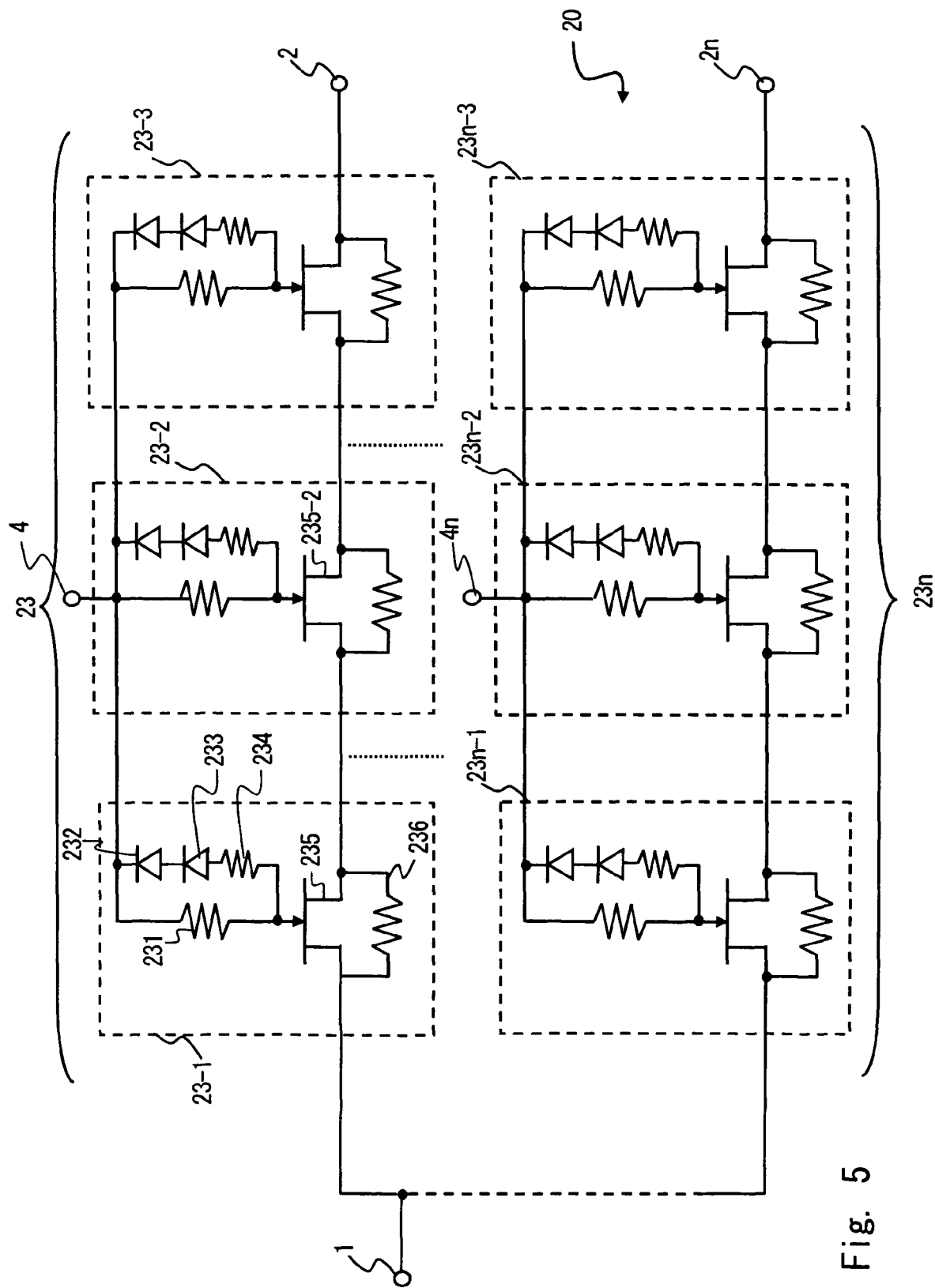
FIG. 5 is a circuit diagram showing a switch circuit 20 in accordance another exemplary embodiment of the present invention.

In the previous exemplary embodiment, a switch circuit, in which a signal provided to the control terminal 4 is changed from a low level to a high level, is explained. In an exemplary embodiment described hereinafter, a switch circuit 20 in accordance with another exemplary embodiment of the present invention, in which a signal provided to the control terminal 4 is changed from a high level to a low level, is explained. FIG. 5 is a circuit diagram showing a switch circuit 20 in accordance with another exemplary embodiment of the present invention. The structures other than the structures within the switch circuits 3 shown in FIG. 1 are the same as those in the previous exemplary embodiment. Therefore, the same signs are assigned to the same components, and explanation of them is omitted. The switch circuit 20 in accordance with this exemplary embodiment of the present invention is different from the previous exemplary embodiment in the switch elements 23. In particular, the structure of each of unit switch elements 23-1-23-3 and 23n-1-23n-3 is different. Since the structures of the unit switch elements (23-1-23-3 and 23n-1-23n-3) are identical with each other in an exemplary embodiment, the structure is explained hereinafter only for the unit switch element 23-1.

The unit switch element 23-1 includes a first resistor 231, diodes 232 and 233, a second resistor 234, a J-FET 235, and a bias supply resistor 236.

The first resistor 231 is connected in series between the control terminal 4 and the control electrode (gate electrode) of the J-FET 235. The diodes 232 and 233 are connected in series between the control terminal 4 and the gate electrode of the J-FET 235. Each of the diodes 232 and 233 is connected such that its anode is located on the gate electrode side of the J-FET 235 and its cathode is located on the control terminal 4 side. The second resistor 234 is connected in series between the diodes 232 and 233 and the gate electrode of the J-FET 235. The diodes 232 and 233 and the second resistor 234 are connected in parallel with the first resistor 231, connecting the control terminal 4 to the gate electrode of the J-FET 235. Note that any given number of diodes can be used as the diodes 232 and 233, and the configuration of the diodes is not limited to the two-stage connection shown in FIG. 5.

The J-FETs 235 are connected in series between the input terminal 1 and the output terminal 2. In an exemplary embodiment, the switch element 23 has such a structure that three J-FETs are connected in series. Therefore, it is configured such that the source (drain) of the J-FET 235 of the unit switch element 23-1 is connected to the source (drain) of the J-FET 235-2 of the unit switch element 23-2. As stated above, since the number of the unit switch elements between the input and output terminals can be arbitrarily selected, the source (drain) of the J-FET 235 may be directly connected to the output terminal 2.

In an exemplary embodiment configured in such a manner, when the control signal is changed from a high level to a low level, the gate potential Vg of the gate electrode is firstly discharged by a current flowing through the diodes 232 and 233 and the second resistor 234. In this regard, this exemplary embodiment is the same as the previous exemplary embodiment except for the current direction. After that, when the inequality Vg<2·VF+R2·Ig is satisfied, it is discharged through the first resistor 231.

Figure 6:
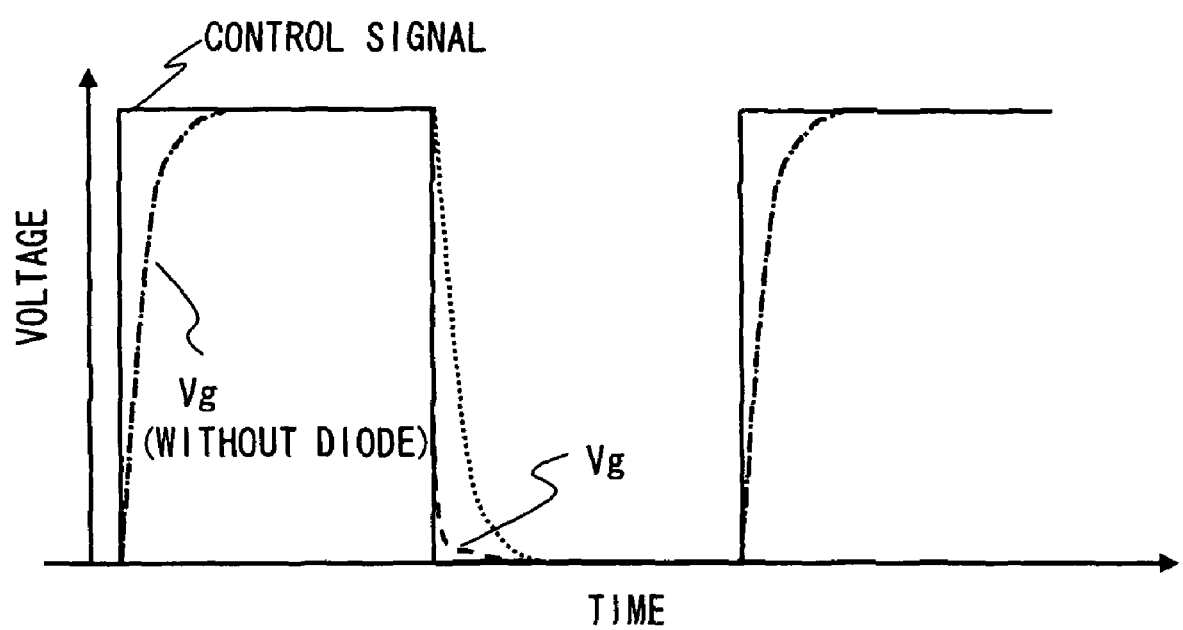
FIG. 6 shows an aspect of changes in a gate potential Vg with respect to a control signal.

With such a configuration, it is possible to follow changes in the control signal at high speed even when the control signal is changed from the high level to the low level (see FIG. 6). In FIG. 6, the solid line represents changes in the control signal input to the control terminal 4, in a similar manner to the example shown in FIG. 2. The broken line represents changes in the gate potential Vg in an exemplary embodiment. Furthermore, the dotted line represents changes in the gate potential Vg in the case where the current path through the diodes 232 and 233 and the second resistor 234 in accordance with an exemplary embodiment of the present invention is not provided. Note that similarly to the previous exemplary embodiment, it is possible to improve the power efficiency without increasing distortion in the switch circuit by interposing the second resistor 234 between the J-FET 235 and the diodes 232 and 233.

First Modified Example

Figure 7:
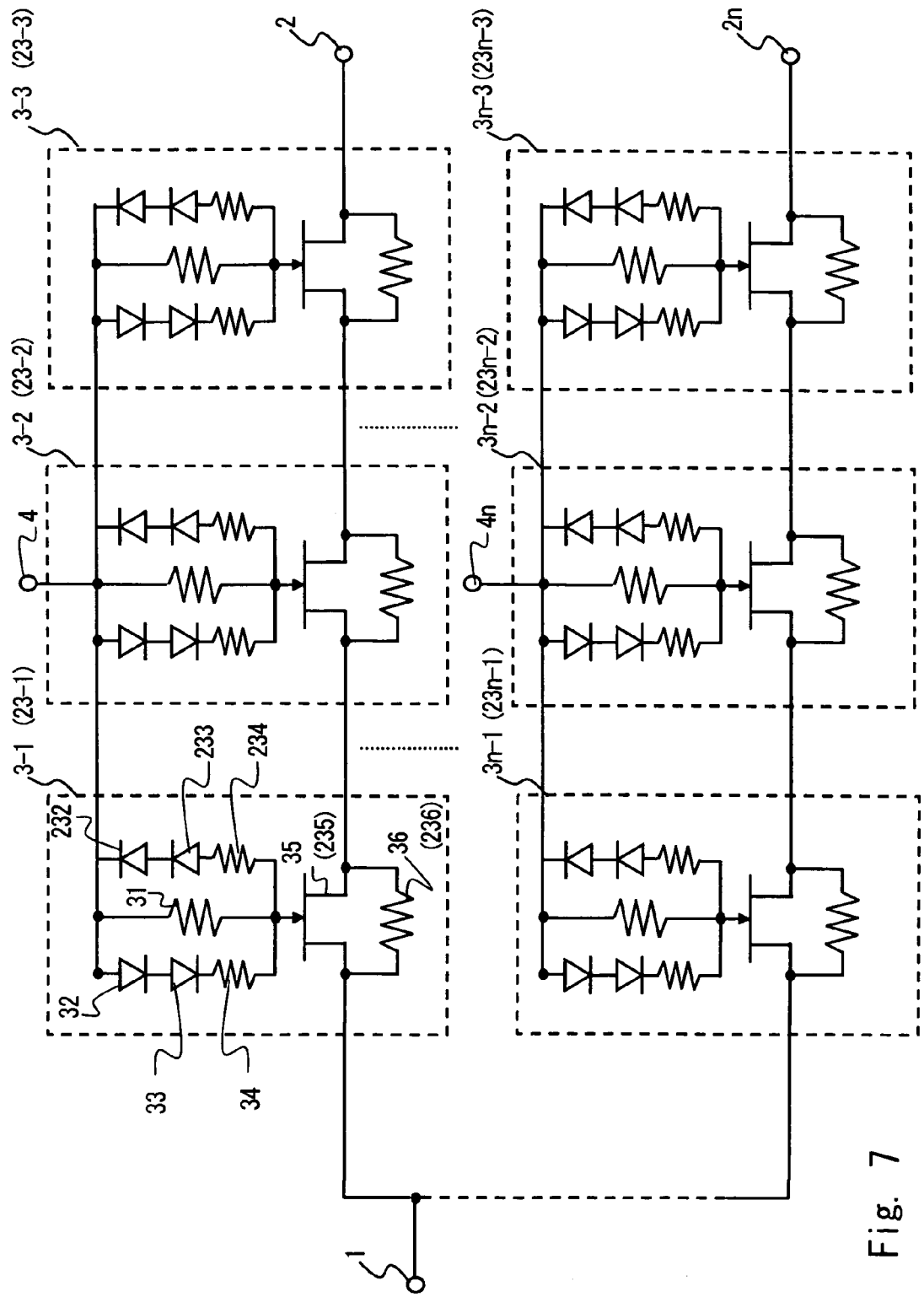
FIG. 7 is a circuit diagram showing a switch circuit in accordance a modified example of the present invention.
Figure 8:
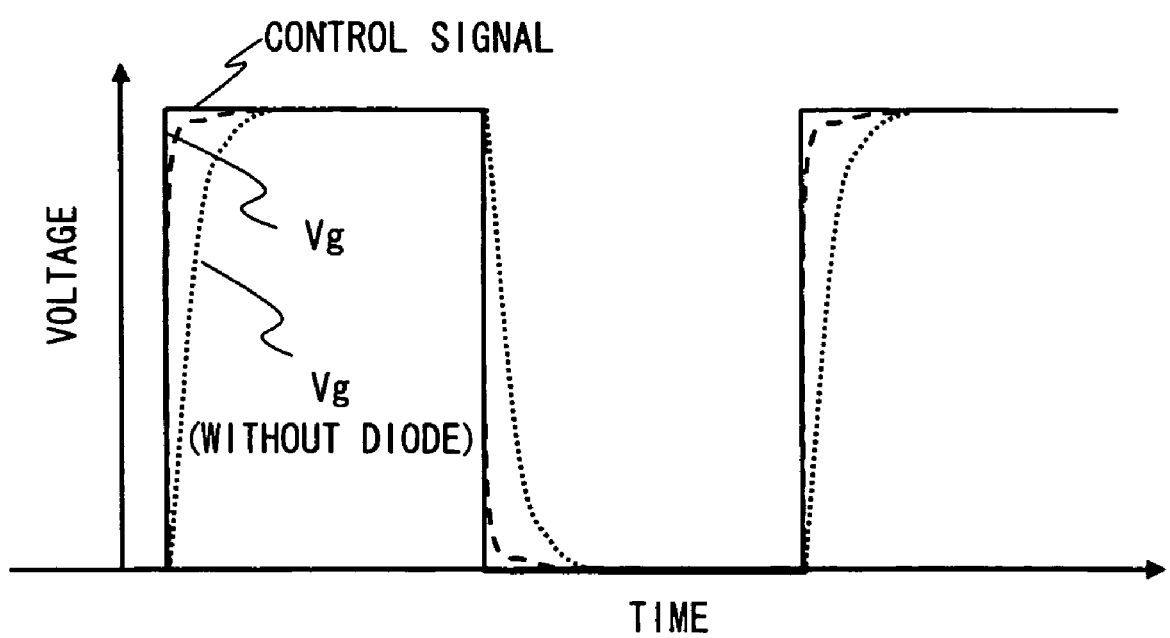
FIG. 8 shows an aspect of changes in a gate potential Vg with respect to a control signal.

FIG. 7 is a circuit diagram showing a modified example of the previous exemplary embodiments. This modified example is formed by combining the switch circuits 10 and 20 explained in the previous exemplary embodiments. Therefore, the same signs are assigned to the same components as those of the previous exemplary embodiments, and explanation of them is omitted. By forming a circuit as shown in FIG. 7, it is possible to make the conductive state of the J-FET follow the changes at high speed regardless of whether the control signal is changed from the low level to the high level or from the high level to the low level. FIG. 8 shows changes in agate potential with respect to changes in a control signal in the switch circuit shown in FIG. 7. Similarly to FIGS. 2 and 6, the solid line represents changes in the control signal input to the control terminal 4. The broken line represents changes in the gate potential Vg in an exemplary embodiment. Furthermore, the dotted line represents changes in the gate potential Vg in the case where the current path through the diodes and the second resistor in accordance with an exemplary embodiment of the present invention is not provided. Note that similarly to the previous exemplary embodiments, it is possible to improve the power efficiency without increasing distortion in the switch circuit by interposing the second resistor 34 (234) between the J-FET 35 (235) and the diodes.

Third Exemplary Embodiment

Figure 9:
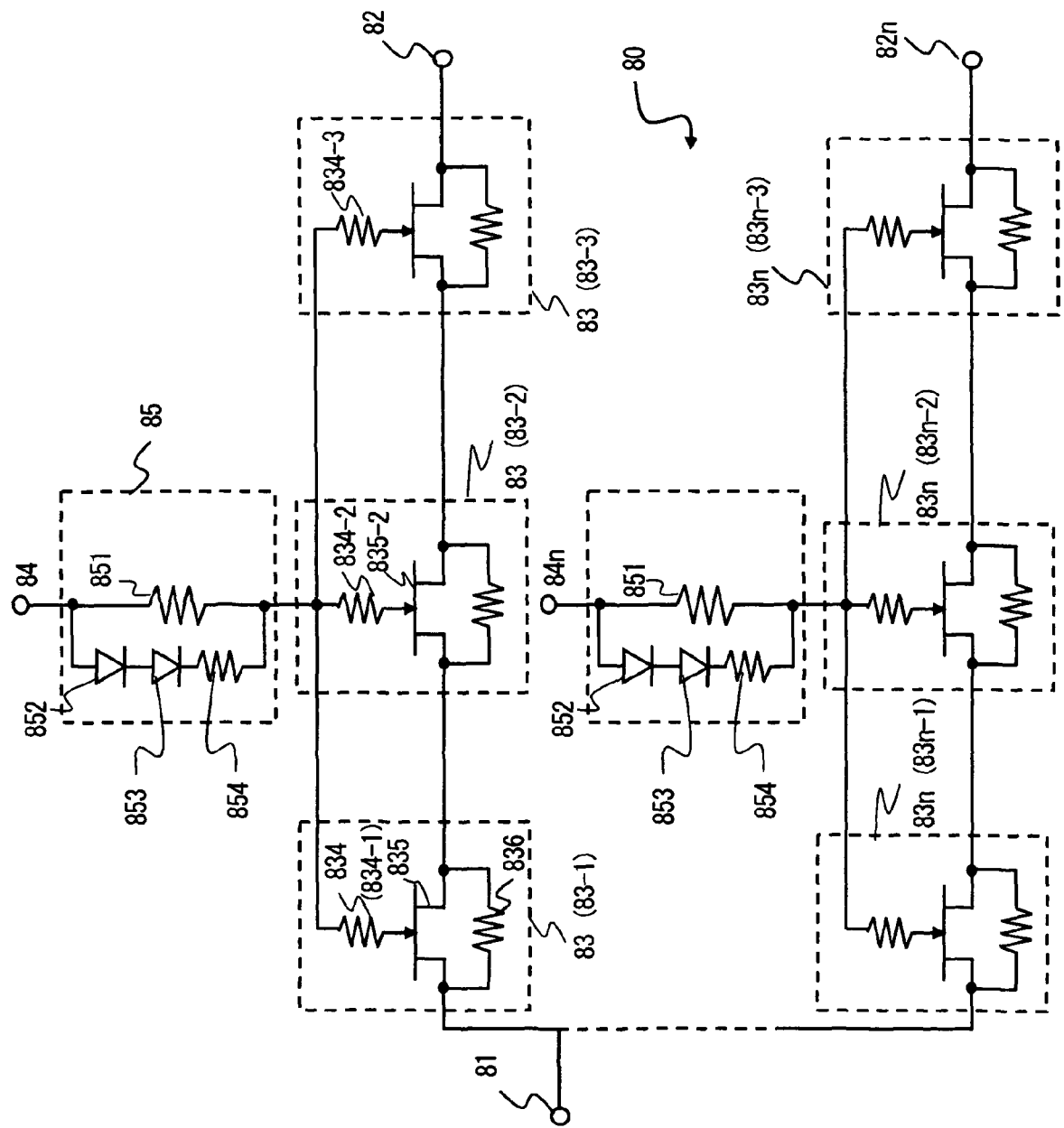
FIG. 9 is a circuit diagram showing a switch circuit 80 in accordance another exemplary embodiment of the present invention.

FIG. 9 is a circuit diagram showing a switch circuit 80 in accordance another exemplary embodiment of the present invention. The switch circuit 80 includes input/output terminal 81 (which is explained as an input terminal hereinafter), a plurality of input/output terminals 82-82n (which are explained as output terminals hereinafter), a plurality of switch elements 83-83n, a plurality of control terminals 84-84n, and a switch element control portion 85. The switch circuit 80 in accordance with an exemplary embodiment of the present invention is a SPnT switch, and is a switch circuit to make a "1-to-n" connection.

Note that the switch elements 83-83n shown in FIG. 9 are switch elements to input and output a signal in a high frequency band such as a frequency band in the order of gigahertz (Ghz). Each of the switch elements 83-83n has a plurality of unit switch elements (83-1-83-3 and 83n-1-83n-3). The plurality of unit switch elements (83-1-83n-3) are connected in series between the input terminal 81 and the output terminals 82-82n. The detailed structure of the unit switch element will be explained later.

Furthermore, although only two output terminals 82 and 82n are shown for the single input terminal 81 in FIG. 9 for simplification of the drawing, it is also possible to have a plurality of output terminals 82k (k is a given natural number) between the output terminals 82 and 82n. Furthermore, although an example where three unit switch elements (83-1-83-3 and 83n-1-83n-3) are connected between the input terminal 81 and the output terminals 82 and 82n is illustrated in FIG. 9, any given number of the unit switch elements, including a single unit switch element, can be connected between the input and output terminals.

The input terminal 81 is a terminal to receive a high frequency signal (RF signal). The input terminal 81 is connected to an antenna or the like, and receives an RF signal received by the antenna. The output terminals 82 and 82n are output terminals to output a signal input to the input terminal 81 to a circuit in a subsequent stage. The control terminals 84-84n are terminals to input control signals to connect the input terminal 81 to a given one of the output terminals 82 and 82n. The input terminal 81 and a given one of the output terminals 82 and 82n are connected based on signals input to these control terminals 84-84n. The switch elements 83-83n are elements to determine the connection state between the input terminal 81 and the output terminals 82 and 82n based on control signals input to the control terminals 84-84n. The switch element control portion 85 is a circuit to control the gate potentials of J-FETs contained in the unit switch elements based on changes in signals input to the control terminals 84-84n.

Since the structures of the unit switch elements (83-1-83-3 and 83n-1-83n-3) used as the switch elements 83-83n are identical with each other in an exemplary embodiment, the detailed structure is explained only for the unit switch element 83-1 and detailed explanation of the structures of other unit switches is omitted.

The unit switch 83-1 includes a second resistor 834 (834-1), a J-FET 835, and a bias supply resistor 836.

The second resistor 834 is connected in series between the switch element control portion 85 and the control electrode (gate electrode) of the J-FET 835. The J-FET 835 is connected in series between the input terminal 81 and the output terminal 82. The switch element 83 in an exemplary embodiment has such a structure that three J-FETs are connected in series. Therefore, it is configured such that the source (drain) of the J-FET 835 of the unit switch element 83-1 is connected to the source (drain) of the J-FET 835-2 of the unit switch element 83-2. As stated above, since the number of the unit switch elements between the input and output terminals can be arbitrarily selected, the source (drain) of the J-FET 835 may be directly connected to the output terminal 82.

The bias supply resistor 836 is a resistive element to adjust the impedance between the input and output terminals when no connection is made between the input and output terminals. The bias supply resistor 836 is connected, between the source and the drain of the J-FET 835, in parallel with the J-FET 835.

The switch element control portion 85 is a circuit to control the gate potential of the J-FET of each of the unit switch elements 83-1-83-3 and 83n-1-83n-3 based on a control signal input to the control terminal 84. The switch element control portion 85 includes a first resistor 851, diodes 852 and 853, and a third resistor 854.

The first resistor 851 is connected in series between the control terminal 84 and the control electrode (gate electrode) of the J-FET 835. More specifically, it is connected in series between the control terminal 84 and the second resistor of the unit switch element (e.g., resistor 834-1). The diodes 852 and 853 are connected in series between the control terminal 84 and the gate electrode of the J-FET 835. More specifically, they are connected in series between the control terminal 84 and the second resistor of the unit switch element (e.g., resistor 834-1). Each of the diodes 852 and 853 is connected such that its anode is located on the control terminal 84 side and its cathode is located on the gate electrode side of the J-FET 835. The third resistor 854 is connected in series between the diodes 852 and 853 and the gate electrode of the J-FET 835. The diodes 852 and 853 and the third resistor 854 are connected in parallel with the first resistor 851, connecting the control terminal 84 to the gate electrode of the J-FET 835. Note that any given number of diodes can be used as the diodes 852 and 853, and the configuration of the diodes is not limited to the two-stage connection shown in FIG. 9.

The differences between the switch circuit 80 having such a structure in accordance with this exemplary embodiment of the present invention and the switch circuit of the firstly-explained exemplary embodiment are explained hereinafter.

In the firstly-explained exemplary embodiment, each of the unit switch elements (3-1-3-3 and 3n-1-3n-3) has diodes and first and second resistors. By contrast, each unit switch element in this exemplary embodiment has only the second resistor, the J-FET, and the bias supply resistor. One end of the second resistor of each unit switch element is connected in common, and connected to the switch element control portion 85. Furthermore, the first resistor 851 and the diodes 852 and 853 are provided in this switch element control portion 85, and they are connected in common with each of the unit switch elements.

The operation of the switch circuit 80 having such a structure in accordance with an exemplary embodiment of the present invention is explained hereinafter. When a potential at the control terminal 84 rises from a low level to a high level, the diodes 852 and 853 and the third resistor 854 are connected in parallel with the first resistor 851. Therefore, if the gate potential of the J-FET 835 is Vg, the threshold voltage of each of the diodes 852 and 853 connected in two stages is VF, the resistance of the second resistor 834-1 is R2, the resistance of the third resistor 854 is R3, and the current flowing from the control terminal 84 to the gate electrode of the J-FET 835 is Ig, the gate potential of the J-FET 835 rises through the current path of the diodes 852 and 853 and the second and third resistors 834-1 and 854 until the following inequality is satisfied.

$$Vg > 2 \cdot VF + (R2 + R3) \cdot Ig$$

After the gate potential Vg reaches the above-described voltage, the gate potential Vg of the J-FET 835 rises by a current flowing through the first resistor 851 and the second resistor 834-1. In this way, the current path through the diodes 852 and 853 and the resistors 854 and 834 is provided as a path to charge the gate electrode of the J-FET 835. Therefore, it is possible to reduce the time necessary to bring the J-FET 835 to the on-state in response to the rise at the control terminal 84.

Note that in order to achieve an equivalent characteristic in the circuit shown in FIG. 9 to that of the firstly-explained exemplary embodiment shown in FIG. 1, the resistances of the second resistors in both the circuits (the second resistor 34 in FIG. 1 and the second resistor 834 (834-1-834-3) in FIG. 9) should be equal to each other. Furthermore, resistances on the paths that are used together with the paths through the diodes to supply currents should be also equal to each other between the circuits shown FIGS. 1 and 9. That is, it is necessary to make the composite resistance of the first resistance of each unit switch element in the firstly-explained exemplary embodiment (combined resistance of the first resisters 34 contained in the unit switch elements 3-1, 3-2, and 3-3) equal to the composite resistance of the resistor 851 of the switch element control portion 85 and the second resistor of each unit switch element (second resistors 834-1-834-3) in the currently-explained exemplary embodiment. When the resistances are adjusted as described above, the resistance of the third resistor 854 contained in the switch element control portion 85 should preferably be zero. By adjusting the resistances in such a manner, it is possible to reduce the number of necessary elements for the switch circuit in comparison with the firstly-explained exemplary embodiment. Therefore, it is also possible to reduce the size of necessary area on the substrate where the switch circuit is formed.

Furthermore, the second resistor 834 is interposed between the J-FET 835 and the diodes 852 and 853. In this manner, it is possible to improve the power efficiency without increasing distortion in the switch circuit as with the firstly-explained exemplary embodiment.

Fourth Exemplary Embodiment

Figure 10:
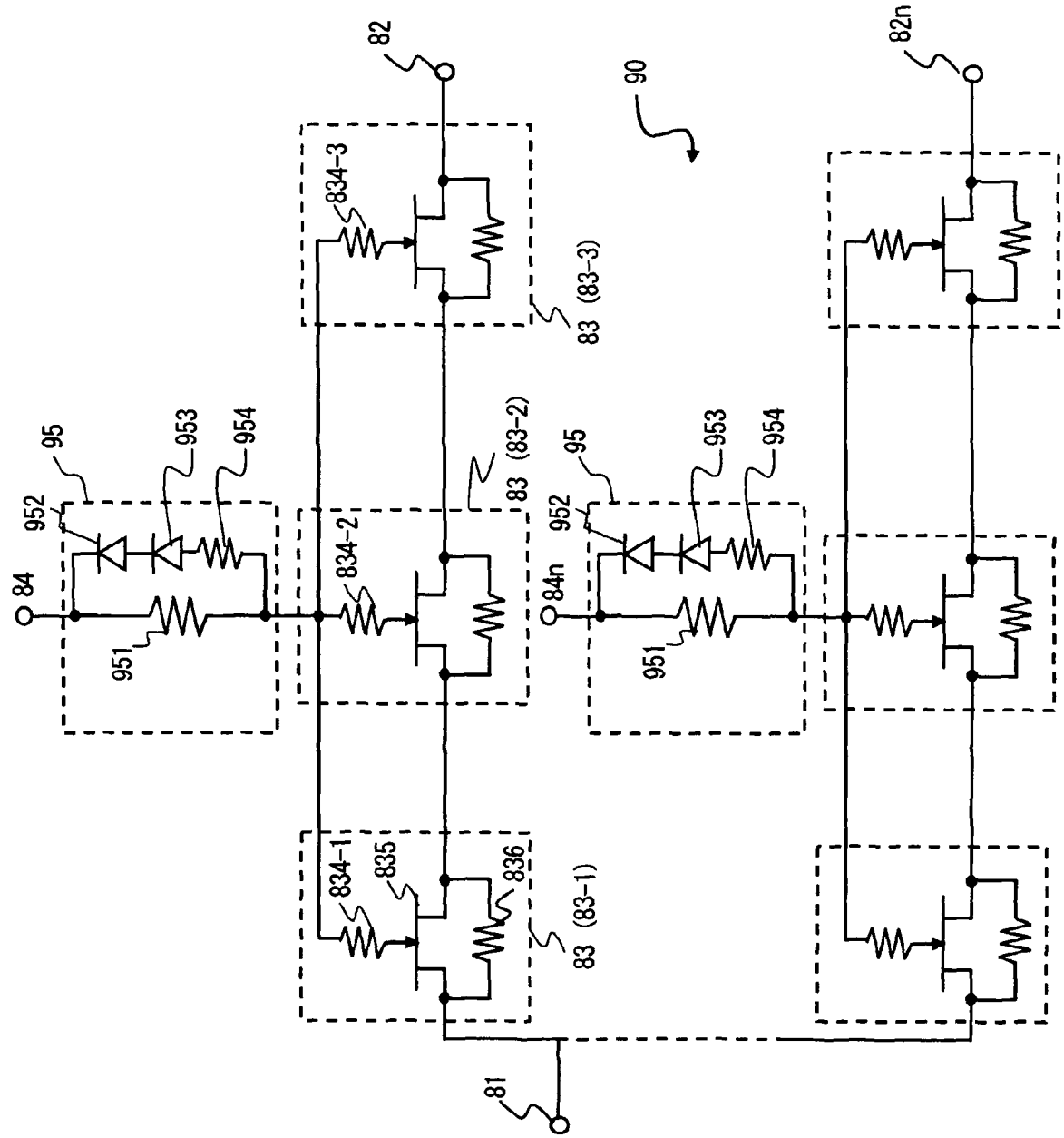
FIG. 10 is a circuit diagram showing a switch circuit 90 in accordance another exemplary embodiment of the present invention.

In the thirdly-explained exemplary embodiment, a switch circuit, in which a signal provided to the control terminal 84 is changed from a low level to a high level, is explained. In an exemplary embodiment described hereinafter, a switch circuit 90 in accordance with another exemplary embodiment of the present invention, in which a signal provided to the control terminal 84 is changed from a high level to a low level, is explained. FIG. 10 is a circuit diagram showing a switch circuit 90 in accordance another exemplary embodiment of the present invention. The structures other than the structures within the switch element control portion 95 are the same as those in the thirdly-explained exemplary embodiment. Therefore, the same signs are assigned and explanation of them is omitted. The switch circuit 90 in accordance with this exemplary embodiment of the present invention is different from that of the thirdly-explained exemplary embodiment in the switch element control portion 95. The switch element control portion 95 includes a first resistor 951, diodes 952 and 953, and a third resistor 954.

The first resistor 951 is connected in series between the control terminal 84 and the control electrode (gate electrode) of the J-FET 835. The diodes 952 and 953 are connected in series between the control terminal 84 and the gate electrode of the J-FET 835. Each of the diodes 952 and 953 is connected such that its anode is located on the gate electrode side of the J-FET 835 and its cathode is located on the control terminal 84 side. The third resistor 954 is connected in series between the diodes 952 and 953 and the gate electrode of the J-FET 835. The diodes 952 and 953 and the third resistor 954 are connected in parallel with the first resistor 951, connecting the control terminal 84 to the gate electrode of the J-FET 835.

In an exemplary embodiment configured in such a manner, when the control signal is changed from a high level to a low level, the gate potential Vg is firstly discharged by a current flowing through the diodes 952 and 953 and the second and third resistors 834 and 951. After that, when the inequality $Vg<2 \cdot VF+(R2+R3) \cdot Ig$ is satisfied, it is discharged through the first resistor 951 and the second resistor 834.

With such a configuration, it is possible to follow changes in the control signal at high speed even when the control signal is changed from the high level to the low level. Furthermore, it is possible to improve the power efficiency without increasing distortion in the switch circuit by interposing the second resistor between the J-FET and the diodes in a similar manner to the firstly-explained exemplary embodiment. Furthermore, it is possible to reduce the number of necessary elements and the size of necessary area for the switch circuit, in comparison with the secondly-explained exemplary embodiment, by establishing the resistance values in a similar manner to the thirdly-explained exemplary embodiment.

Second Modified Example

Figure 11:
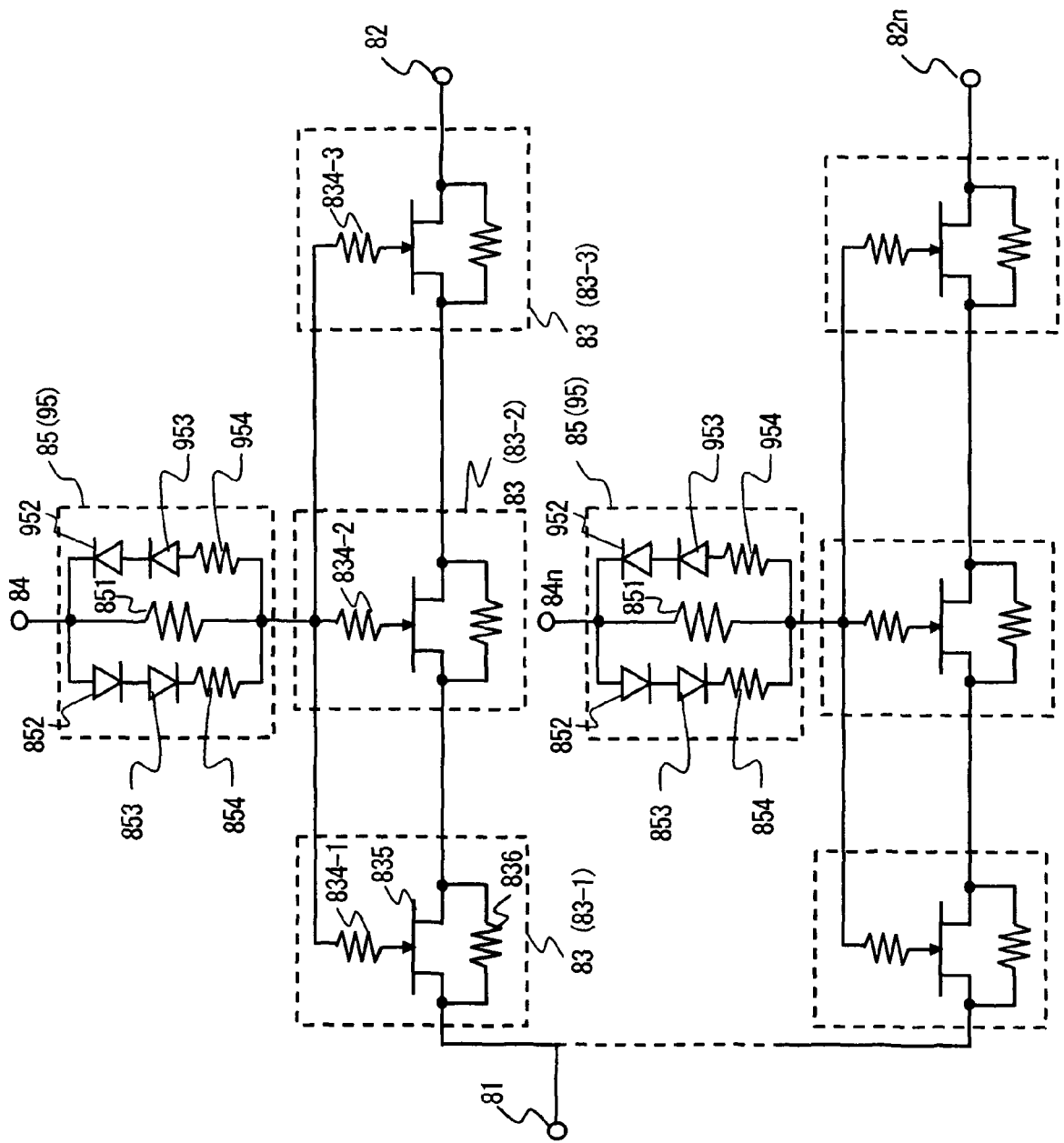
FIG. 11 is a circuit diagram showing a switch circuit in accordance another modified example of the present invention.

FIG. 11 is a circuit diagram showing another modified example of the thirdly and fourthly explained exemplary embodiments. This modified example is formed by combining the switch circuits 80 and 90 explained in the previous exemplary embodiments, and therefore the same signs are assigned to the same components as those of the previous exemplary embodiments, and explanation of them is omitted. By forming a circuit as shown in FIG. 11, it is possible to make the conductive state of the J-FET follow the changes in the control signal at high speed regardless of whether the control signal is changed from the low level to the high level or from the high level to the low level.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A switch circuit, comprising:
   a first transistor connected in series between input and output terminals;
   a control terminal that receives a signal to control a conductive state of the transistor;
   a first resistor connected between a control electrode of the transistor and the control terminal; and
   a series circuit comprising:
      a first diode and a second resistor, the series circuit being connected in parallel with the first resistor between the control terminal and the control electrode of the transistor, and
      a second diode serially connected to said first diode.

2. The switch circuit according to claim 1, wherein an anode of the first diode is connected on a control terminal side and a cathode of the first diode is connected on a control electrode side.

3. The switch circuit according to claim 1, wherein an anode of the first diode is connected on a control electrode side and a cathode of the first diode is connected on a control terminal side.

4. The switch circuit according to claim 1, wherein:
   a plurality of the series circuits is connected in parallel;
   at least one of the series circuits comprises a first diode, an anode of the first diode being connected on a control terminal side and a cathode of the first diode being connected on a control electrode side; and
   at least another one of the series circuits comprises a second diode, an anode of the second diode being connected on the control electrode side and a cathode of the second diode being connected on the control terminal side.

5. The switch circuit according to claim 1, further comprising a second transistor,
   wherein the first transistor and the second transistor are connected in series between the input and output terminals.

6. The switch circuit according to claim 1, further comprising a third resistor, one end of the third resistor being connected to the control electrode of the first transistor and an other end of the third resistor being connected to the first resistor and the series circuit.

7. The switch circuit according to claim 6, further comprising:
   a second transistor; and
   a fourth resistor, one end of the fourth resistor being connected to control electrode of the second transistor and an other end of the fourth resistor connected to the first resistor and the series circuit.

8. The switch circuit according to claim 1, further comprising a bias supply resistor that connects a source and a drain of the first transistor.

9. The switch circuit according to claim 1, wherein the second resistor is connected between the second diode and the control electrode of the first transistor.

10. A switch circuit, comprising:
    a transistor having a source associated with a first node, a drain associated with a second node, and a control electrode associated with a third node;
    an input terminal associated with the first node;
    an output terminal associated with the second node;
    a control terminal associated with a fourth node;
    a first resistor provided between the third node and fourth node; and a series circuit associated with the third node, said series circuit comprising:
  a second resistor provided between the third node and fourth node and in parallel with the first resistor;
  a first diode provided between the third node and fourth, node, said first diode being provided in parallel with the first resistor and in series with the second resistor; and
  a second diode provided between the third node and fourth node and in parallel with the first resistor and in series with the first diode.

11. The switch circuit according to claim 10, further comprising a bias supply resistor arranged between the first node and the second node and in parallel with the transistor.

12. A semiconductor device, comprising:
an input terminal;
an output terminal;
a plurality of switch circuits, said plurality of switch circuits being provided in series between the input port and the output port, each of said switch circuits comprising:
  a transistor having a source associated with a first node, a drain associated with a second node, and a control electrode associated with a third node;
  an input terminal associated with the first node;
  an output terminal associated with the second node;
  a control terminal associated with a fourth node; and
  a first resistor provided between the third node and fourth node; and
a plurality of series circuits associated with a respective third node of a respective one of the plurality of switch circuits, each of said series circuits comprising:
  a second resistor provided between the third node and fourth node and in parallel with the first resistor;
  a first diode provided between the third node and fourth node, said first diode being provided in parallel with the first resistor and in series with the second resistor; and
  a second diode provided between the third node and fourth node and in parallel with the first resistor and in series with the first diode,
wherein, in a first switch circuit of the plurality of switch circuits, said first node is associated the input terminal of the semiconductor device,
wherein, in a final switch circuit of the plurality of switch circuits, said second node is associated the output terminal of the semiconductor device, and
wherein, in between respective consecutive switch circuits of the plurality of switch circuits, a respective second node is associated with a first node of a following switch circuit.

13. The semiconductor device according to claim 12, wherein each of the plurality of switch circuits further comprises a bias supply resistor arranged between the first node and the second node and in parallel with the transistor.

14. The semiconductor device according to claim 12, wherein said fourth node is associated with said control terminal of the plurality of switch circuits in parallel.

15. A semiconductor device, comprising:
an input terminal;
an output terminal;
a control terminal associated with a fourth node;
a plurality of switch circuits, said plurality of switch circuits being provided in series between the input port and the output port, each of said switch circuits comprising:
  a transistor having a source associated with a first node, a control electrode, and a drain associated with a second node;
  an input terminal associated with the first node; and
  an output terminal associated with the second node;
a third node being connected in common with one end of each control electrode resistor, the other end of each control electrode resistor being connected to each control electrode of each transistor of said plurality of switch circuits;
a first resistor provided between the third node and the fourth node; and
a series circuit associated with the third node, said series circuit comprising:
  a second resistor provided between the third node and fourth node and in parallel with the first resistor;
  a first diode provided between the third node and fourth node, said first diode being provided in parallel with the first resistor and in series with the second resistor; and
  a second diode provided between the third node and fourth node and in parallel with the first resistor and in series with the first diode.

16. The semiconductor device according to claim 15, wherein, in a first switch circuit of the plurality of switch circuits, said first node is associated with the input terminal of the semiconductor device,
wherein, in a final switch circuit of the plurality of switch circuits, said second node is associated the output terminal of the semiconductor device, and
wherein, in between respective consecutive switch circuits of the plurality of switch circuits, a respective second node is associated with a first node of a following switch circuit.

* * * * *